(12) United States Patent
Iwata

(10) Patent No.: US 7,782,103 B2
(45) Date of Patent: Aug. 24, 2010

(54) PHASE ADJUSTMENT CIRCUIT

(75) Inventor: Toru Iwata, Osaka (JP)

(73) Assignee: Panasonic Corporation, Osaka (JP)

( * ) Notice: Subject to any disclaimer, the term of this patent is extended or adjusted under 35 U.S.C. 154(b) by 847 days.

(21) Appl. No.: 11/513,023

(22) Filed: Aug. 31, 2006

(65) Prior Publication Data

US 2007/0080728 A1 Apr. 12, 2007

(30) Foreign Application Priority Data

Oct. 12, 2005 (JP) ............................ 2005-297742

(51) Int. Cl.
*H03L 7/06* (2006.01)
(52) U.S. Cl. .................. 327/156; 327/141; 375/354; 375/371; 375/373; 375/376
(58) Field of Classification Search .............. 375/354, 375/371, 376
See application file for complete search history.

(56) References Cited

U.S. PATENT DOCUMENTS

| | | | |
|---|---|---|---|
| 5,946,268 A | 8/1999 | Iwamoto et al. | |
| 6,166,572 A * | 12/2000 | Yamaoka | ..................... 327/149 |
| 6,346,837 B1 | 2/2002 | Shibayama | |
| 2003/0155953 A1 | 8/2003 | Hirata et al. | |
| 2003/0227310 A1* | 12/2003 | Iwata | ......................... 327/165 |

FOREIGN PATENT DOCUMENTS

| | | |
|---|---|---|
| JP | 9-261018 A | 10/1997 |
| JP | 11-004219 | 1/1999 |
| JP | 11-074783 | 3/1999 |
| JP | 11-88153 A | 3/1999 |
| JP | 2001-84763 A | 3/2001 |
| JP | 2003-308133 | 10/2003 |

OTHER PUBLICATIONS

Japanese Notice of Reasons for Rejection, w/ English translation thereof, issued in Japanese Patent Application No. JP 2005-297742 dated Apr. 20, 2010.

* cited by examiner

*Primary Examiner*—David C Payne
*Assistant Examiner*—Leon Flores
(74) *Attorney, Agent, or Firm*—McDermott Will & Emery LLP

(57) ABSTRACT

A phase adjustment circuit for discretely adjusting a phase of a data signal and that of a clock signal, the phase adjustment circuit including: a delay line for delaying the clock signal to produce a delayed clock signal; a phase comparator for comparing the phase of the data signal with that of the delayed clock signal; a delay control section for outputting a delay control signal based on the comparison result from the phase comparator; and a delay control section for outputting a delay control signal based on a frequency of the clock signal. The delay line determines a delay amount of the delayed clock signal with respect to the clock signal based on the control signals.

2 Claims, 8 Drawing Sheets

PHASE ADJUSTMENT CIRCUIT

CROSS REFERENCE TO RELATED APPLICATION

This application claims priority under 35 U.S.C. §119 on Patent Application No. 2005-297742 filed in Japan on Oct. 12, 2005, the entire contents of which are hereby incorporated by reference.

BACKGROUND OF THE INVENTION

The present invention relates to a phase adjustment circuit and, more particularly, to a technique for discretely adjusting the phase relationship between a clock signal and a data signal in data communications.

In order to realize fast data transmission, it is necessary that data signals are input/output in synchronism with the clock signal. Particularly, where the frequency of the clock signal is over 100 MHz, it is necessary to use a PLL (Phase Locked Loop) or a DLL (Delay Locked Loop) to realize synchronization between the external clock signal to be supplied from outside the semiconductor integrated circuit and the internal clock signal to be used within the semiconductor integrated circuit.

FIG. 8 shows a configuration of a conventional phase adjustment circuit. The phase adjustment circuit is implemented as a digital DLL including a digital delay line 100 for delaying a clock signal CLK to produce a delayed clock signal Rclk, a phase comparator 101 for comparing the phase of the data signal Data with that of the delayed clock signal Rclk, and a delay control section 102 for controlling the amount of signal delay along the digital delay line 100 based on the comparison result from the phase comparator 101 (see, for example, Japanese Laid-Open Patent Publication No. 9-261018 and Japanese Laid-Open Patent Publication No. 11-88153).

A digital DLL is characteristic in that it is easy to design and the circuit scale thereof is relatively small. Therefore, using a digital DLL as the phase adjustment circuit, one can expect a reduction in the circuit area and power consumption, and the ease in design when there is a change of the process.

Typically, a digital delay line includes a plurality of delay units. By changing the number of delay units to be connected together in series, it is possible to adjust the gain of the digital delay line. In order to optimally adjust the timing between a data signal and a delayed clock signal, it is preferred that the amount of signal delay per delay unit, i.e., the delay resolution set along the digital delay line, is as small as possible with respect to the data rate. However, if the delay resolution of the digital delay line is excessively small, the phase adjusting speed may not be fast enough for variations in the phase of the data signal and that of the clock signal.

The phase adjusting speed is calculated as the delay resolution of the digital delay line multiplied by the number of times adjustment is done per unit time, which is the number of times the transition of the data signal and that of the clock signal are compared with each other by the phase comparator. Therefore, in a case where the data rate is low and the number of transitions per unit time is small, the phase adjusting speed may not be fast enough for the phase varying speed, whereby the data signal cannot properly be latched by the clock signal.

At present, there are various data transmission standards with different data rates. In order to optimize the performance of communications technology in conformity to one of the various data transmission standards, the gain of the digital delay line should be determined according to the data rate. Specifically, it is necessary to ensure a sufficient range over which the phase adjustment can be done while using a high phase adjustment resolution for fine adjustment in the case of a high data rate and using a lower phase adjustment resolution so as to suppress the circuit scale in the case of a low data rate.

However, as described above, the delay resolution (also referred to as the "minimum delay amount") of the digital delay line is dictated by the delay amount per delay unit in the digital delay line, which is a fixed amount. Therefore, with the conventional phase adjustment circuit, it is difficult to optimally adjust the delay resolution according to the data rate.

SUMMARY OF THE INVENTION

In view of the problem, it is an object of the present invention to realize a phase adjustment circuit capable of optimally adjusting the phase relationship between the data signal and the delayed clock signal whether the data rate is high or low.

In order to solve the problem, the present invention provides a phase adjustment circuit for discretely adjusting a phase of a data signal and that of a clock signal, the phase adjustment circuit including: a delay line for delaying the clock signal to produce a delayed clock signal; a phase comparator for comparing the phase of the data signal with that of the delayed clock signal; a first delay control section for outputting a first delay control signal based on the comparison result from the phase comparator; and a second delay control section for outputting a second delay control signal based on a frequency of the clock signal. The delay line determines a delay amount of the delayed clock signal with respect to the clock signal based on the first and second delay control signals.

Thus, the delay line producing the delayed clock signal determines the delay amount of the delayed clock signal with respect to the clock signal based on the first delay control signal output from the first delay control section based on the comparison result from the phase comparator and the second delay control signal output from the second delay control section based on the frequency of the clock signal. Therefore, it is possible to change the gain of the delay line based not only on the phase difference between the data signal and the delayed clock signal, but also on the frequency of the clock signal input to the delay line, and hence the data rate of the data signal.

Specifically, the delay line includes: a plurality of delay units for delaying an input signal and outputting the delayed signal; and a connection control section for changing the number of the delay units to be connected together in series based on one of the first and second delay control signals, wherein each of the delay units includes a delay adjustment section for adjusting an amount of signal delay based on the other one of the first and second delay control signals.

More specifically, the other one of the first and second delay control signals is a digital signal; and the delay adjustment section includes a plurality of loads connected together in parallel, and selectively connects or disconnects each of the loads based on the digital signal.

More specifically, the other one of the first and second delay control signals is an analog signal; and the delay adjustment section changes an amount of signal delay based on the analog signal.

Specifically, the delay line includes: a plurality of delay unit groups each including a plurality of delay units for delaying an input signal and outputting the delayed signal; and a first connection control section for changing the number of the delay unit groups to be connected together in series based on one of the first and second delay control signals, wherein each of the delay units includes a second connection control section for changing the number of the delay units to be connected together in parallel in the delay unit group based on the other one of the first and second delay control signals.

Specifically, the second delay control section is a PLL including an oscillator for producing the clock signal; and the second delay control signal is a signal for controlling the oscillator.

More specifically, the oscillator is a digitally-controlled oscillator; and the second delay control signal is a digital signal for controlling the digitally-controlled oscillator.

More specifically, the oscillator is a voltage-controlled oscillator; and the second delay control signal is a voltage signal for controlling the voltage-controlled oscillator.

Specifically, the second delay control section is a DLL including a delay circuit receiving the clock signal; and the second delay control signal is a signal for controlling the delay circuit.

More specifically, the delay circuit is a digital delay line; and the second delay control signal is a digital signal for controlling the digital delay line.

More specifically, the delay circuit is a voltage-controlled delay circuit; and the second delay control signal is a voltage signal for controlling the voltage-controlled delay circuit.

As described above, the present invention provides a phase adjustment circuit used in data transmission having a transmission path such as a cable, wherein even when a digital delay line is used, it is possible to optimally adjust the relationship between the data rate and the delay line gain. Therefore, it is possible to realize both a desirable data-receiving quality and advantages associated with the use of a digital delay line, e.g., reducing the area and the power consumption, and making easier the process porting and the designing process.

DESCRIPTION OF THE PREFERRED EMBODIMENTS

First Embodiment

Figure 1:
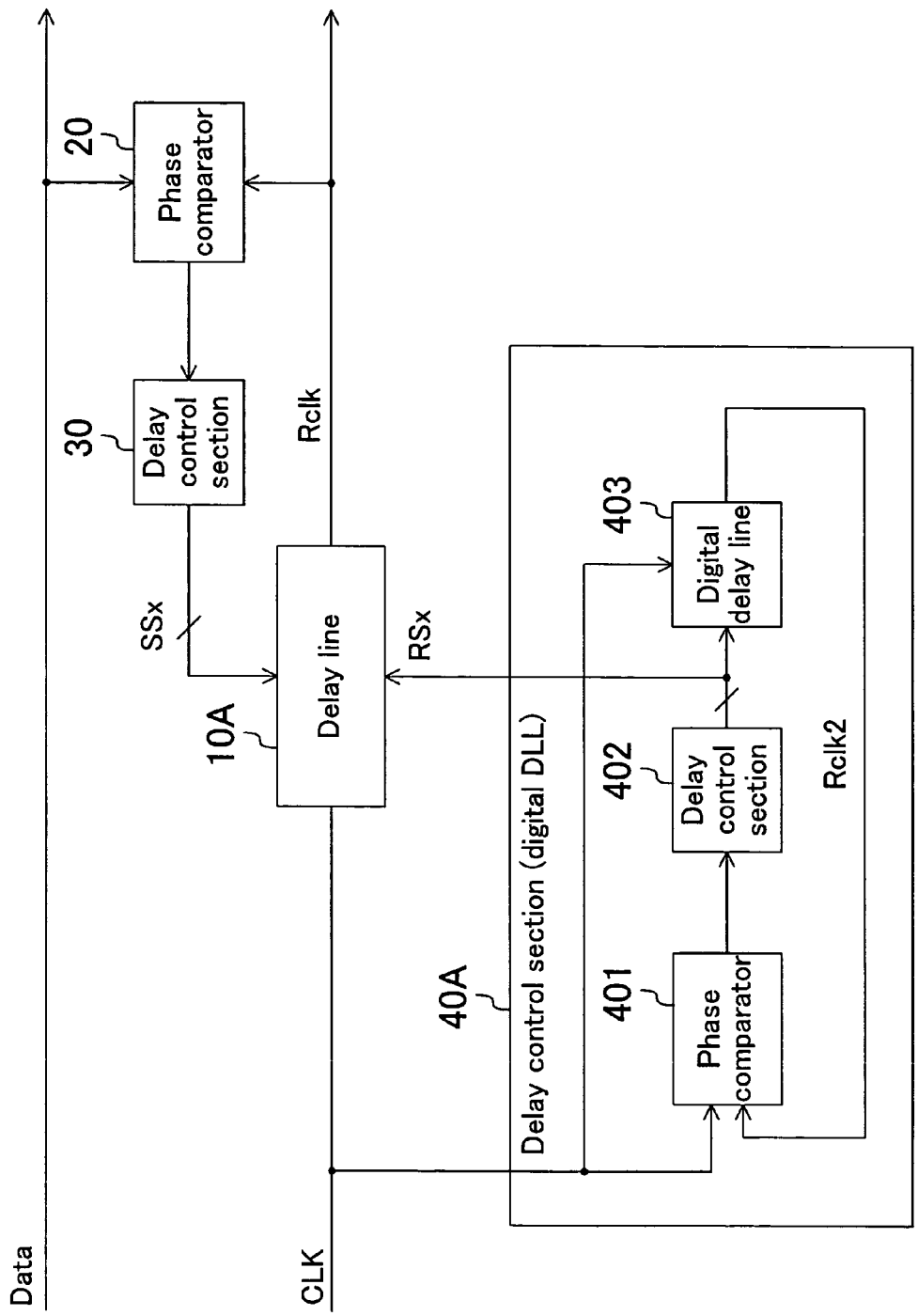
FIG. 1 shows a configuration of a phase adjustment circuit according to a first embodiment of the present invention.

FIG. 1 shows a configuration of a phase adjustment circuit according to a first embodiment of the present invention. The phase adjustment circuit includes a delay line 10A for delaying the clock signal CLK to produce the delayed clock signal Rclk, a phase comparator 20 for comparing the phase of the data signal Data with that of the delayed clock signal Rclk, a delay control section 30 for outputting a control signal SSx (x being a suffix) based on the comparison result from the phase comparator 20, and a delay control section 40A for outputting a control signal RSx (x being a suffix) based on the frequency of the clock signal CLK. The data signal Data is sampled by a latch circuit (not shown) using the delayed clock signal Rclk outputted from the phase adjustment circuit.

Figure 2:
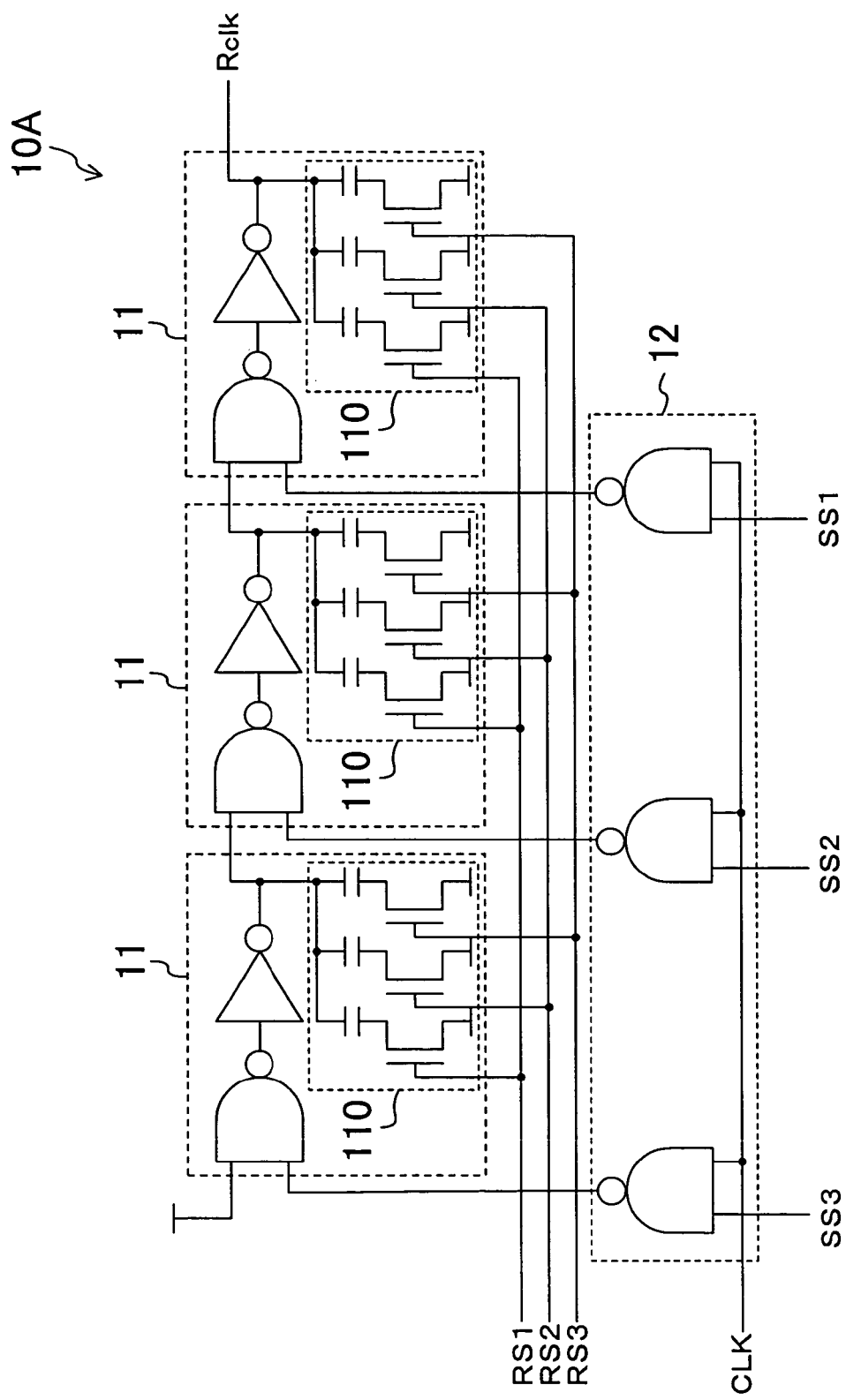
FIG. 2 shows an example of a circuit configuration of a delay line shown in FIG. 1.

The delay line 10A determines the delay amount of the delayed clock signal Rclk with respect to the clock signal CLK based on the control signals SSx and RSx. FIG. 2 shows an example of a circuit configuration of the delay line 10A. The delay line 10A includes a plurality of (three in the illustrated example) delay units 11, and a connection control section 12 for changing the number of the delay units 11 to be connected together in series based on the control signal SSx.

Each delay unit 11 delays an input signal and outputs a delayed signal, and includes a delay adjustment section 110 for adjusting the amount of signal delay based on the control signal RSx. The delay adjustment section 110 includes a plurality of (three in the illustrated example) capacitors, and a plurality of (three in the illustrated example) transistors each connected in series with one of the capacitors for controlling the number of capacitors to be connected together in parallel based on the control signal RSx. Thus, the minimum delay amount of the delay line 10A is changed discretely according to the control signal RSx.

Figure 3:
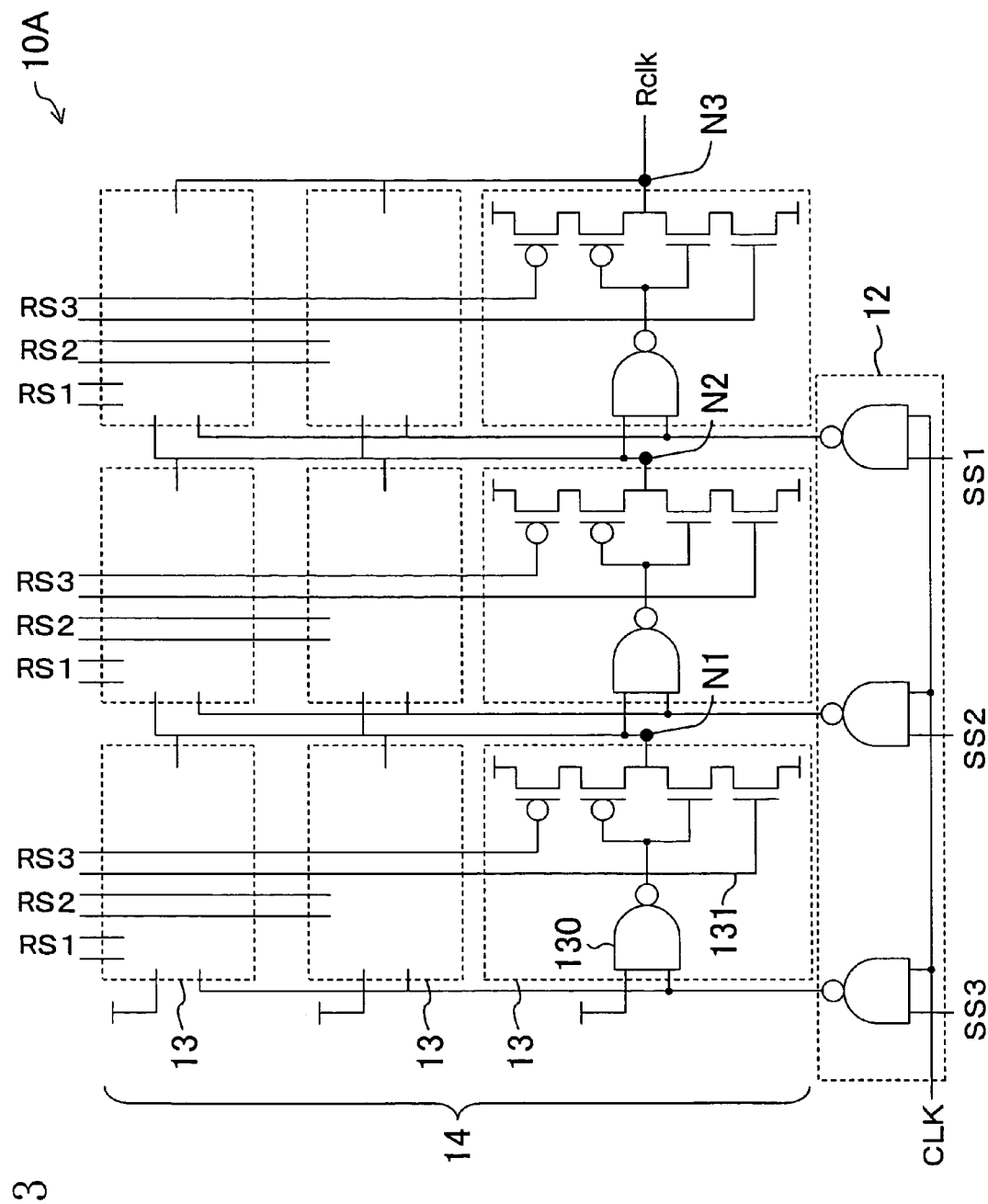
FIG. 3 shows another example of a circuit configuration of the delay line shown in FIG. 1.

FIG. 3 shows another example of a circuit configuration of the delay line 10A. The delay line 10A includes a plurality of (three in the illustrated example) delay unit groups 14 each including a plurality of (three in the illustrated example) delay units 13, and the connection control section 12 for changing the number of the delay unit groups 14 to be connected together in series based on the control signal SSx. Each delay unit 13 includes a NAND gate 130, and a tristate inverter 131 connected thereto. The total gate delay of the NAND gate 130 and the tristate inverter 131 is the delay amount of the delay unit 13.

In the delay unit group 14, the output of each tristate inverter 131 is controlled by some (e.g., RS1) of the control signal RSx. The delay units 13 belonging to one delay unit group 14 are connected together in parallel, and the outputs thereof are commonly connected to a node Nx (x being a suffix). The number of units to be connected together in parallel changes according to the control signal RSx. The load capacitance of the node Nx is constant, irrespective of the status of connection of the delay units 13. Therefore, the delay amount of the delay unit group 14 is smaller as the number of the delay units 13 to be connected together in parallel in the delay unit group 14 is larger. Thus, the minimum delay amount of the delay line 10A is changed discretely according to the control signal RSx.

Referring back to FIG. 1, the delay control section 40A is implemented as a digital DLL including a phase comparator 401 for comparing the phase of the clock signal CLK with that of a delayed clock signal Rclk2, a delay control section 402 for outputting the control signal RSx based on the comparison result from the phase comparator 401, and a digital delay line 403 for delaying the clock signal CLK to produce the delayed clock signal Rclk2 according to the control signal RSx. The delay control section 402 controls the digital delay line 403 so that the delayed clock signal Rclk2 is one cycle behind the clock signal CLK. Although not shown, the digital delay line 403 includes delay units, and controls the delay amount of the delayed clock signal Rclk2 with respect to the clock signal CLK according to the control signal RSx. Specifically, the control signal RSx output from the delay control section 402 optimally controls the delay units in the digital delay line 403 according to the frequency of the clock signal CLK. Therefore, by controlling the delay line 10A using the control signal RSx, the amount of signal delay to be imposed by the delay line 10A, i.e., the gain of the delay line 10A, can be linked with the cycle of the clock signal CLK. Since the data signal Data and the frequency of the clock signal CLK are in a predetermined relationship, the gain of the delay line 10A is controlled according essentially to the data rate of the data signal Data.

Specifically, the delay line 10A is controlled according to the control signal RSx so that the minimum delay amount is larger when the clock signal CLK is slow and the minimum delay amount is smaller when the clock signal CLK is fast. Therefore, it is possible to accommodate substantial variations of the data phase when the data rate is low, while it is possible to suppress the jitter in the delayed clock signal Rclk when the data rate is high. Thus, it is possible to optimally adjust the phase relationship between the data signal Data and the delayed clock signal Rclk whether the data rate is high or low.

According to the ratio between the number of delay units (not shown) in the digital delay line 403 and the number of the delay units 11 shown in FIG. 2 or the delay unit groups 14 shown in FIG. 3, the delay amount of each delay unit in the digital delay line 403 and the delay amount of each delay unit 11 or the delay unit group 14 can be controlled so that the ratio therebetween is as described above. For example, where the number of delay units in the digital delay line 403 is equal to the number of the delay units 11 or the delay unit groups 14, the delay amount of each delay unit in the digital delay line 403 and the delay amount of each delay unit 11 or each delay unit group 14 can be set to the same value.

Preferably, a circuit configuration similar to that of the delay unit 11 shown in FIG. 2 or that of the delay unit group 14 shown in FIG. 3 is employed for the delay unit (not shown) of the digital delay line 403. Thus, it is possible to further enhance the linearity between the minimum delay amount of the delay line 10A and the cycle of the clock signal CLK. If there is no need for a high response precision of the minimum delay amount of the delay line 10A with respect to the clock signal CLK, the delay unit in the digital delay line 403 and the delay unit 11 or the delay unit group 14 may employ different circuit configurations.

The capacitors of the delay adjustment section 110 shown in FIG. 2 do not need to be of the same capacitance value, but may have somewhat different capacitance values. Similarly, the delay units 13 forming the delay unit group 14 shown in FIG. 3 do not need to be of the same configuration. Specifically, the delay units 13 of the delay unit group 14 may have different gains, wherein one of the delay units 13 is selectively connected according to the control signal RSx.

In the delay line 10A shown in FIGS. 2 and 3, the control signal SSx and the control signal RSx may be switched around. Specifically, the minimum delay amount of the delay line 10A may be changed according to the control signal SSx output from the delay control section 30.

Second Embodiment

Figure 4:
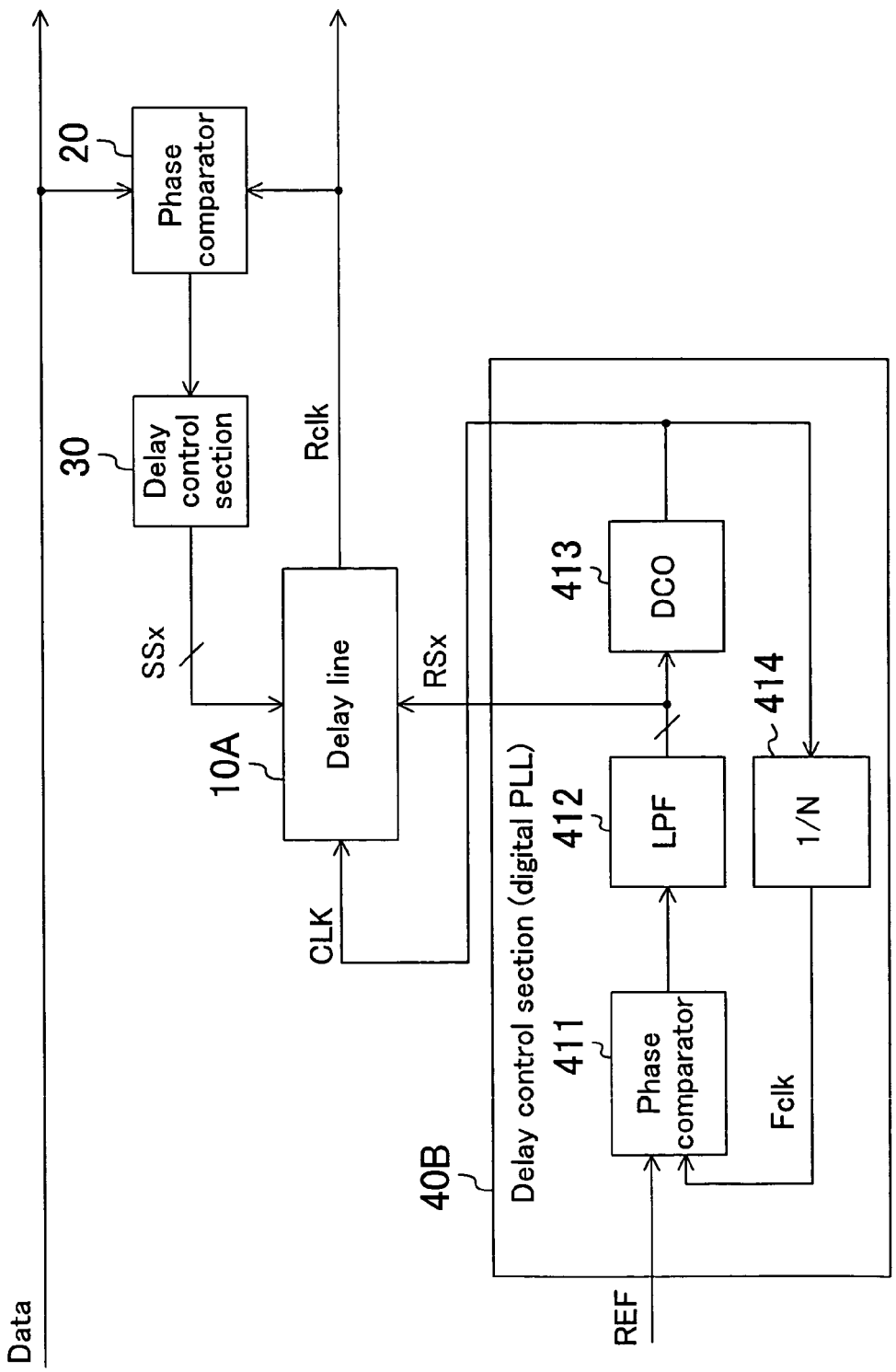
FIG. 4 shows a configuration of a phase adjustment circuit according to a second embodiment of the present invention.

FIG. 4 shows a configuration of a phase adjustment circuit according to a second embodiment of the present invention. The phase adjustment circuit includes a delay control section 40B instead of the delay control section 40A in the phase adjustment circuit shown in FIG. 1.

The delay control section 40B is implemented as a digital PLL including a phase comparator 411 for comparing the phase of the reference clock signal REF with that of the feedback clock signal Fclk, a loop filter 412 for outputting the control signal RSx based on the comparison result from the phase comparator 411, a digitally-controlled oscillator 413 for producing the clock signal CLK according to the control signal RSx, and a frequency divider 414 for dividing the frequency of the clock signal CLK to produce the feedback clock signal Fclk.

Although not shown, the digitally-controlled oscillator 413 includes delay units, and produces the clock signal CLK according to the control signal RSx. Therefore, by controlling the delay line 10A using the control signal RSx, the gain of the delay line 10A can be linked with the cycle of the clock signal CLK. Since the data signal Data and the frequency of the clock signal CLK are in a predetermined relationship, the gain of the delay line 10A is controlled according essentially to the data rate of the data signal Data.

As described above, by controlling the delay line 10A in such a manner that it is linked with the internal control of the digital PLL producing the clock signal CLK, it is possible to adjust the minimum delay amount according to the frequency of the clock signal CLK.

Third Embodiment

Figure 5:
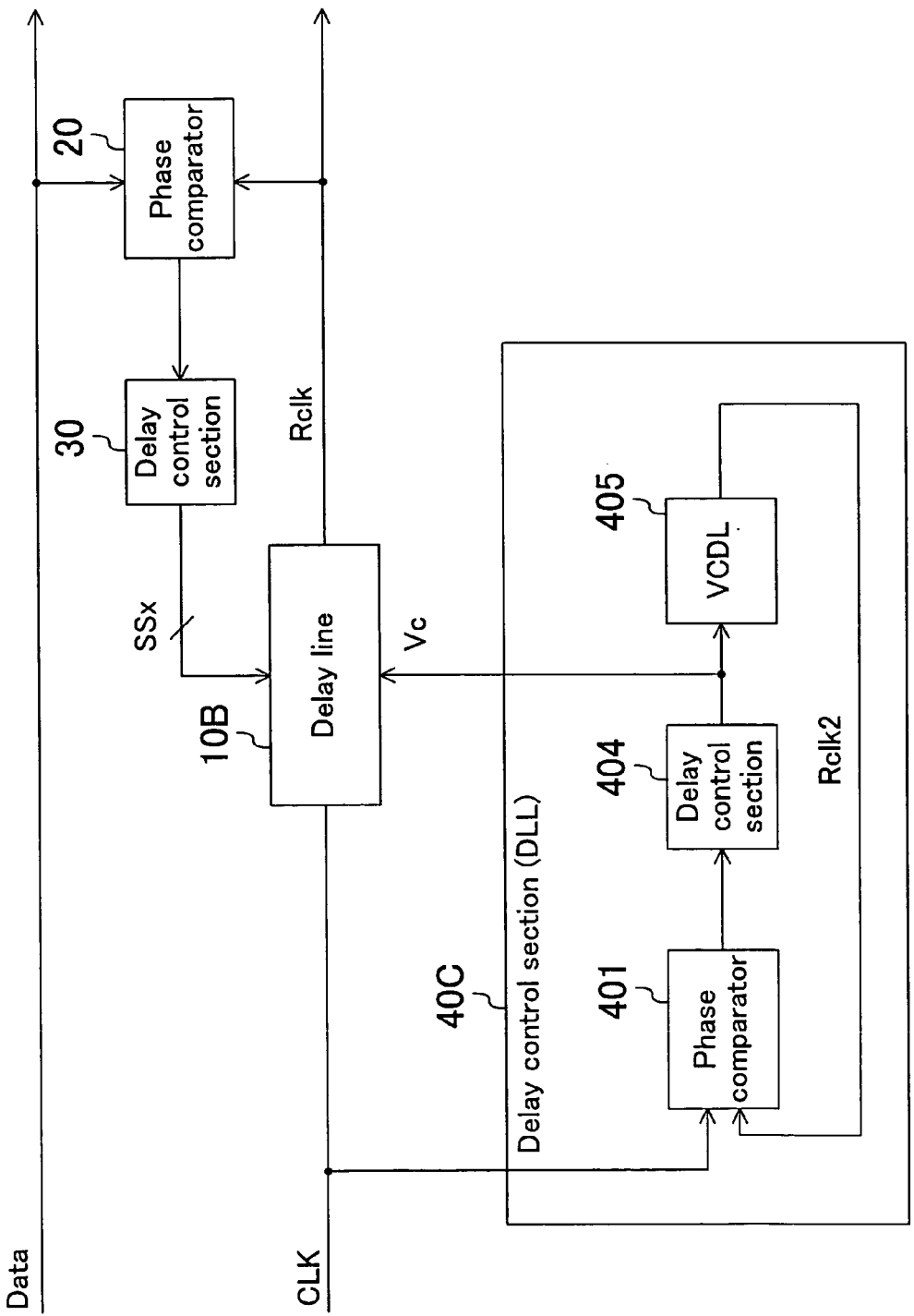
FIG. 5 shows a configuration of a phase adjustment circuit according to a third embodiment of the present invention.

FIG. 5 shows a configuration of a phase adjustment circuit according to a third embodiment of the present invention. The phase adjustment circuit includes a delay line 10B and a delay control section 40C instead of the delay line 10A and the delay control section 40A in the phase adjustment circuit shown in FIG. 1.

Figure 6:
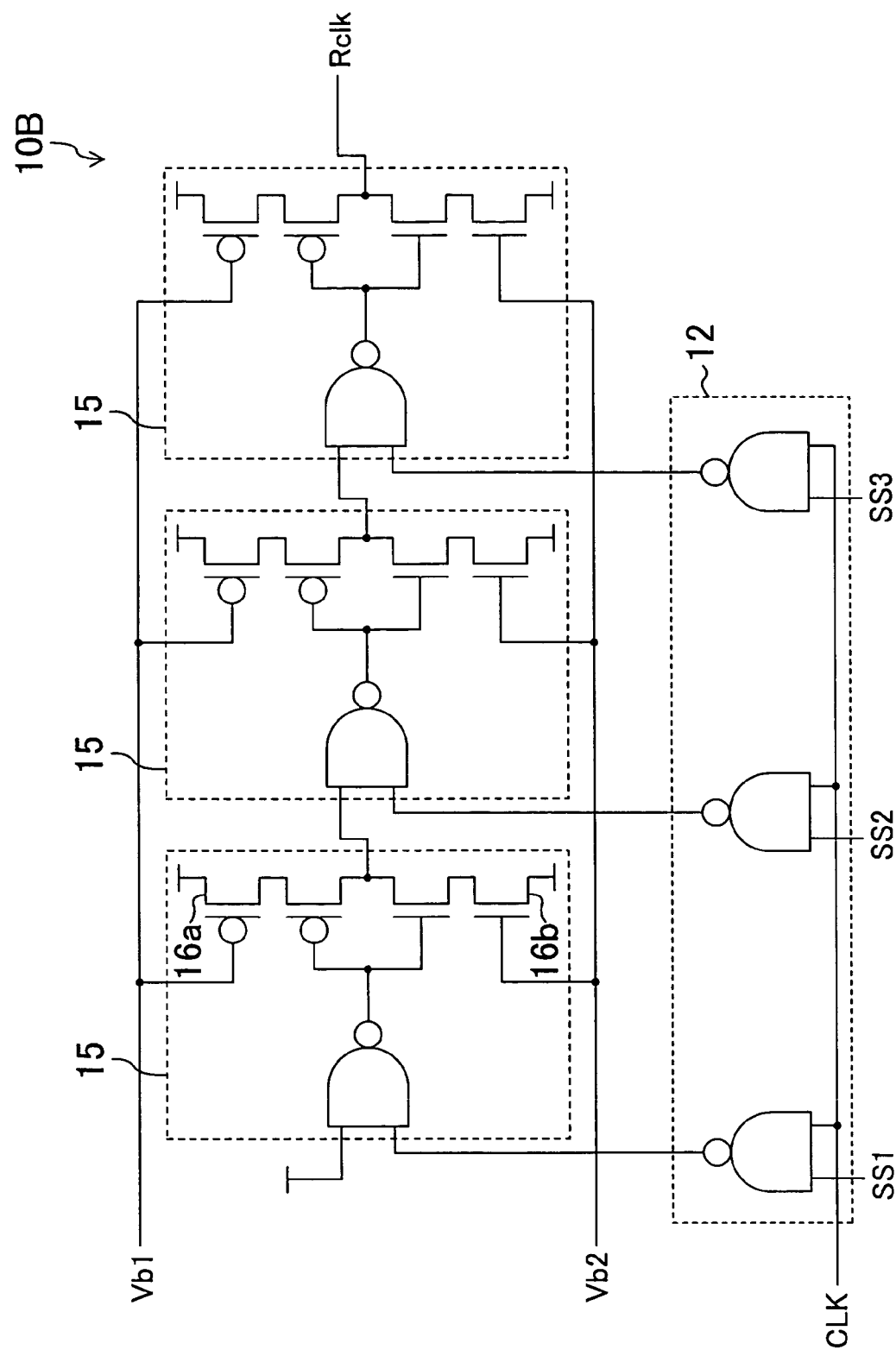
FIG. 6 shows an example of a circuit configuration of a delay line shown in FIG. 5.

The delay line 10B determines the delay amount of the delayed clock signal Rclk with respect to the clock signal CLK based on the control signals SSx and Vc. The control signal Vc is an analog signal (voltage signal). FIG. 6 shows an example of a circuit configuration of the delay line 10B. The delay line 10B includes a plurality of (three in the illustrated example) the delay units 15, and the connection control section 12 for changing the number of the delay units 15 to be connected together in series based on the control signal SSx.

Each delay unit 15 delays an input signal and outputs a delayed signal, and includes a PMOS transistor 16a and an NMOS transistor 16b, which receive bias voltages Vb1 and Vb2, respectively, at their gates. These transistors correspond to the delay adjustment section. The bias voltages Vb1 and Vb2 are obtained by converting the control signal Vc for controlling a PMOS transistor and an NMOS transistor, respectively. Therefore, the delay amount of the delay unit 15 is changed continuously according to the control signal Vc. The gain of the delay line 10B is the delay amount of the delay unit 15 changing continuously according to the control signal Vc multiplied by the number of the delay units 15 to be connected together in series discretely set according to the control signal SSx.

Referring back to FIG. 5, the delay control section 40C includes a delay control section 404 for outputting the control signal Vc based on the comparison result from the phase comparator 401 and a voltage-controlled delay circuit 405 for delaying the clock signal CLK according to the control signal Vc to produce the delayed clock signal Rclk2, instead of the delay control section 402 and the digital delay line 403 in the delay control section 40A shown in FIG. 1. The delay control section 404 controls the voltage-controlled delay circuit 405 so that the delayed clock signal Rclk2 is one cycle behind the clock signal CLK. Although not shown, the voltage-controlled delay circuit 405 includes delay units, and controls the delay amount of the delayed clock signal Rclk2 with respect to the clock signal CLK according to the control signal Vc. Specifically, the control signal Vc output from the delay control section 404 optimally controls the delay units in the voltage-controlled delay circuit 405 according to the frequency of the clock signal CLK. Therefore, by continuously controlling the delay line 10B using the control signal Vc, the gain of the delay line 10B can be linked with the cycle of the clock signal CLK. Since the data signal data and the frequency of the clock signal CLK are in a predetermined relationship, the gain of the delay line 10B is controlled according essentially to the data rate of the data signal Data.

Specifically, the delay line 10B is controlled according to the control signal Vc so that the minimum delay amount is larger when the clock signal CLK is slow and the minimum delay amount is smaller when the clock signal CLK is fast. Therefore, it is possible to accommodate substantial variations of the data phase when the data rate is low, while it is possible to suppress the jitter in the delayed clock signal Rclk when the data rate is high. Thus, it is possible to optimally adjust the phase relationship between the data signal data and the delayed clock signal Rclk whether the data rate is high or low.

The delay control section 30 may be altered so as to output the control signal Vc, instead of the control signal SSx, and the delay control section 40C may be altered, by employing a digital DLL as shown in FIG. 1, to output the control signal SSx. Even with such alterations, the gain of the delay line 10B when the data rate is low can be higher than that when the data rate is high.

Fourth Embodiment

Figure 7:
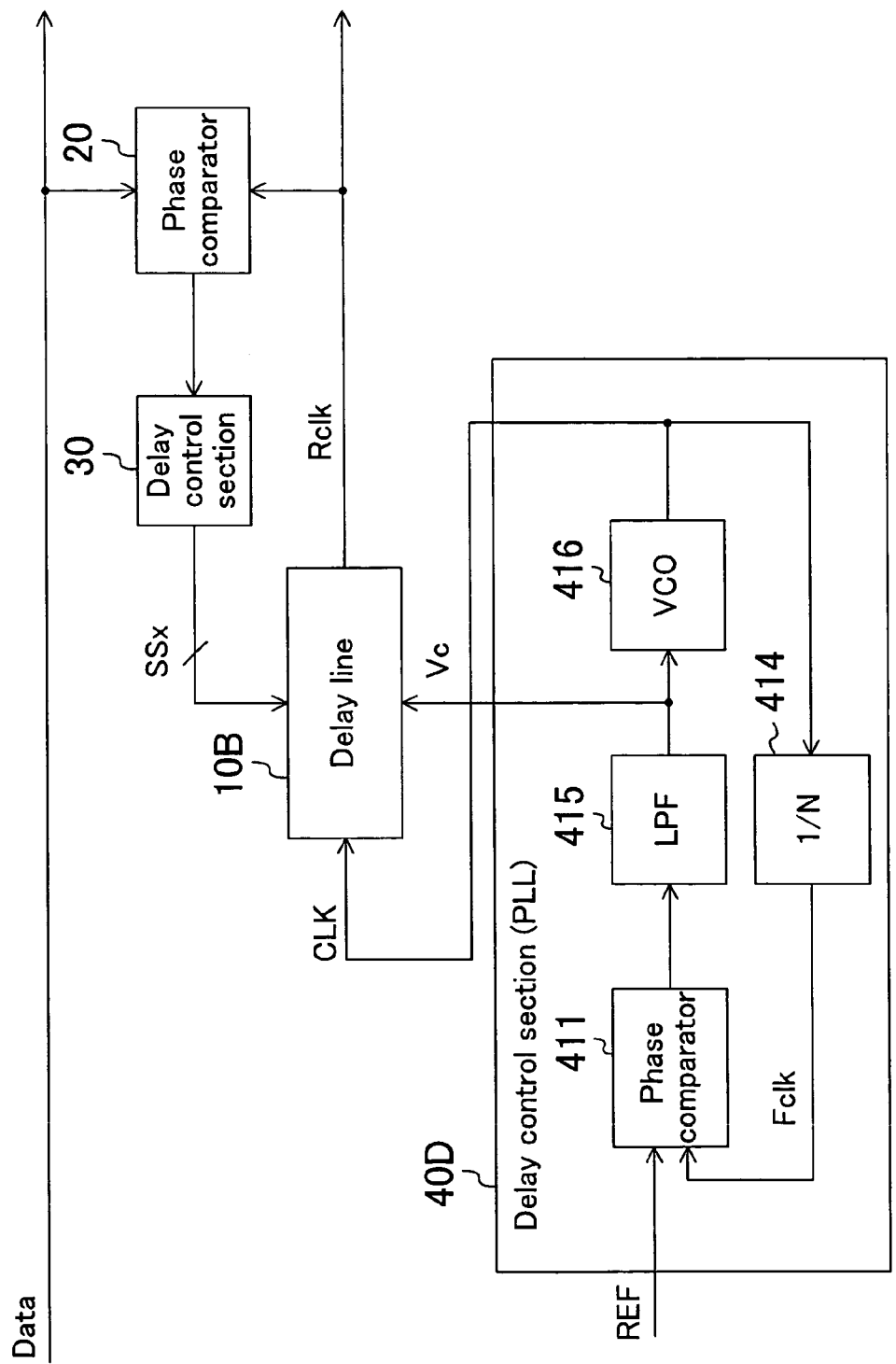
FIG. 7 shows a configuration of a phase adjustment circuit according to a fourth embodiment of the present invention.
Figure 8:
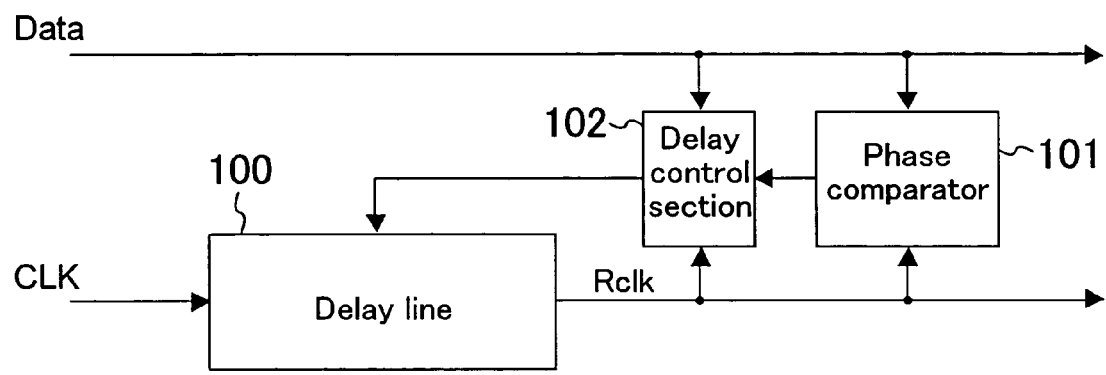
FIG. 8 shows a configuration of a conventional phase adjustment circuit.

FIG. 7 shows a configuration of a phase adjustment circuit according to a fourth embodiment of the present invention. The phase adjustment circuit includes a delay control section 40D instead of the delay control section 40C in the phase adjustment circuit shown in FIG. 5.

The delay control section 40D includes a loop filter 415 for outputting the control signal Vc based on the comparison result from the phase comparator 411, and a voltage-controlled oscillator 416 for producing the clock signal CLK according to the control signal Vc, instead of the loop filter 412 and the digitally-controlled oscillator 413 in the delay control section 40B shown in FIG. 4. Although not shown, the voltage-controlled oscillator 416 includes delay units, and produces the clock signal CLK according to the control signal Vc. Therefore, by continuously controlling the delay line 10B using the control signal Vc, the gain of the delay line 10B can be linked with the cycle of the clock signal CLK. Since the data signal Data and the frequency of the clock signal CLK are in a predetermined relationship, the gain of the delay line 10B is controlled according essentially to the data rate of the data signal Data.

As described above, by controlling the delay line 10B in such a manner that it is linked with the internal control of a frequency synthesizer or a clock recovery PLL producing the clock signal CLK, it is possible to adjust the minimum delay amount according to the frequency of the clock signal CLK.

The delay control section 30 may be altered so as to output the control signal Vc, instead of the control signal SSx, and the delay control section 40D may be altered, by employing a digital PLL as shown in FIG. 4, to output the control signal SSx. Even with such alterations, the gain of the delay line 10B when the data rate is low can be higher than that when the data rate is high.

While a DLL or a PLL is used for detecting the frequency of the clock signal CLK in the description above, the present invention is not limited thereto. For example, data rate information may be embedded in the communications protocol, and the data rate may be detected by a logic circuit. In such a case, the control may be done so that the gain of the delay line is increased when the data rate is low and the gain of the delay line is decreased when the data rate is high. Even before the gain of the delay line is adjusted, it is necessary to guarantee a data-receiving quality with an acceptable error rate.

While the gain of the delay line is increased when the data rate is low and the gain of the delay line is decreased when the data rate is high in the above description, the relationship between the data rate and the gain of the delay line may be determined differently in view of the jitter characteristics relationship between the data rate and the data signal Data, the characteristics of the receiver circuit subsequent to the delay adjustment circuit, etc.

The phase adjustment circuit of the present invention, being capable of optimally adjusting the phase relationship between the data signal and the delayed clock signal whether the data rate is high or low, is useful as a phase adjustment circuit of a receiver LSI in a data transmission system.

What is claimed is:

1. A phase adjustment circuit for discretely adjusting a phase of a data signal and that of a clock signal, the phase adjustment circuit comprising:

a delay line for delaying the clock signal to produce a delayed clock signal;

a phase comparator for comparing the phase of the data signal with that of the delayed clock signal;

a first delay control section for outputting a first delay control signal based on the comparison result from the phase comparator, the first delay control signal being a digital signal; and a second delay control section for outputting a second delay control signal based on a frequency of the clock signal, the second delay control signal being a digital signal, wherein the delay line determines a delay amount of the delayed clock signal with respect to the clock signal based on the first and second delay control signals, wherein the delay line includes:

a plurality of delay units for delaying an input signal and outputting the delayed signal; and a connection control section for changing the number of the delay units to be connected together in series based on one of the first and second delay control signals, wherein each of the delay units includes a delay adjustment section for adjusting an amount of signal delay based on the other one of the first and second delay control signals, and wherein the delay adjustment section includes a plurality of loads connected together in parallel, and selectively connects or disconnects each of the loads based on the other one of the first and second delay control signals.

2. A phase adjustment circuit for discretely adjusting a phase of a data signal and that of a clock signal, the phase adjustment circuit comprising:

a delay line for delaying the clock signal to produce a delayed clock signal;

a phase comparator for comparing the phase of the data signal with that of the delayed clock signal;

a first delay control section for outputting a first delay control signal based on the comparison result from the phase comparator, the first delay control signal being a digital signal; and a second delay control section for outputting a second delay control signal based on a frequency of the clock signal, the second delay control signal being a digital signal, wherein the delay line determines a delay amount of the delayed clock signal with respect to the clock signal based on the first and second delay control signals, and wherein the delay line includes:
  a plurality of delay unit groups each including a plurality of delay units for delaying an input signal and outputting the delayed signal; and
  a first connection control section for changing the number of the delay unit groups to be connected together in series based on one of the first and second delay control signals, wherein each of the delay units includes a second connection control section for changing the number of the delay units to be connected together in parallel in the delay unit group based on the other one of the first and second delay control signals.

* * * * *